(12) United States Patent
Watanabe et al.

(10) Patent No.: US 10,848,697 B2
(45) Date of Patent: Nov. 24, 2020

(54) IMAGE SENSORS WITH PHASE DETECTION AUTO FOCUS PIXELS

(71) Applicant: OmniVision Technologies, Inc., Santa Clara, CA (US)

(72) Inventors: Kazufumi Watanabe, Mountain View, CA (US); Chih-Wei Hsiung, San Jose, CA (US); Vincent Venezia, Los Gatos, CA (US); Dyson Tai, San Jose, CA (US); Lindsay Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 103 days.

(21) Appl. No.: 16/103,257

(22) Filed: Aug. 14, 2018

(65) Prior Publication Data

US 2020/0059618 A1    Feb. 20, 2020

(51) Int. Cl.
*H04N 5/369* (2011.01)
*H01L 27/146* (2006.01)

(52) U.S. Cl.
CPC ... *H04N 5/36961* (2018.08); *H01L 27/14621* (2013.01); *H01L 27/14627* (2013.01); *H01L 27/14645* (2013.01)

(58) Field of Classification Search
CPC .......... H04N 5/36961; H01L 27/14621; H01L 27/14627; H01L 27/14645
See application file for complete search history.

(56) References Cited

U.S. PATENT DOCUMENTS

| | | | |
|---|---|---|---|
| 2014/0198239 A1* | 7/2014 | Suzuki | H04N 5/23212 348/246 |
| 2017/0272642 A1* | 9/2017 | Zhang | H04N 5/3696 |
| 2017/0347042 A1* | 11/2017 | Borthakur | H04N 5/355 |
| 2018/0254297 A1* | 9/2018 | Cho | H01L 27/14645 |
| 2019/0067346 A1* | 2/2019 | Borthakur | H01L 27/14643 |
| 2019/0075233 A1* | 3/2019 | Galor Gluskin | H04N 9/04557 |
| 2019/0335110 A1* | 10/2019 | Kobayashi | H04N 5/367 |

\* cited by examiner

*Primary Examiner* — Lin Ye
*Assistant Examiner* — John H Morehead, III

(57) ABSTRACT

An image sensor pixel array comprises a center region and two parallel edge regions, wherein the center region is between the two parallel edge regions. The center region comprises a plurality of image pixels disposed along first sub-array of rows and columns, wherein each of the plurality of image pixels comprises a first micro-lens (ML) formed at an offset position above a first light receiving element as a countermeasure for shortening of exit pupil distance of the image pixel in the center region, and each of the two parallel edge regions comprises a plurality of phase detection auto-focus (PDAF) pixels disposed along second sub-array of rows and columns, wherein each of the plurality of PDAF pixels comprises a second micro-lens (ML) formed at an alignment position above a second light receiving element; and at least one of the PDAF pixels is located at a distance away from center of the edge region to receive incident light along an injection tilt angle.

12 Claims, 5 Drawing Sheets

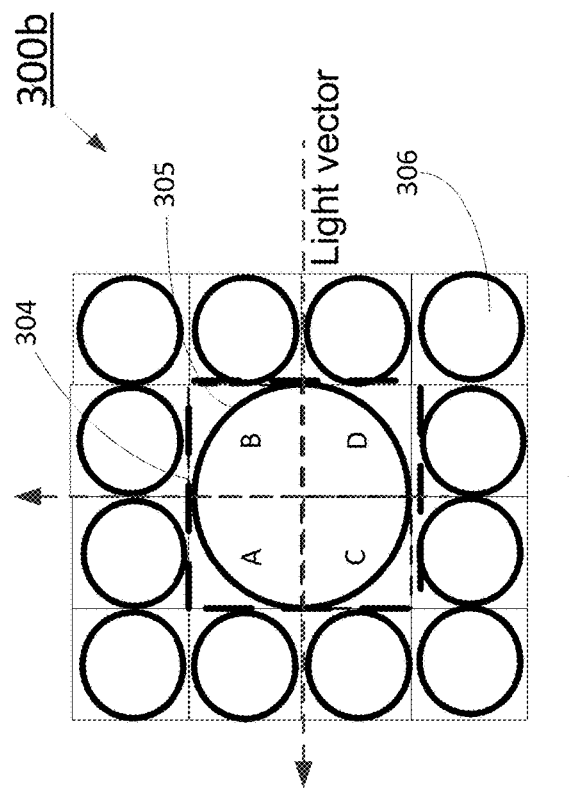
FIG. 3a
FIG. 3b
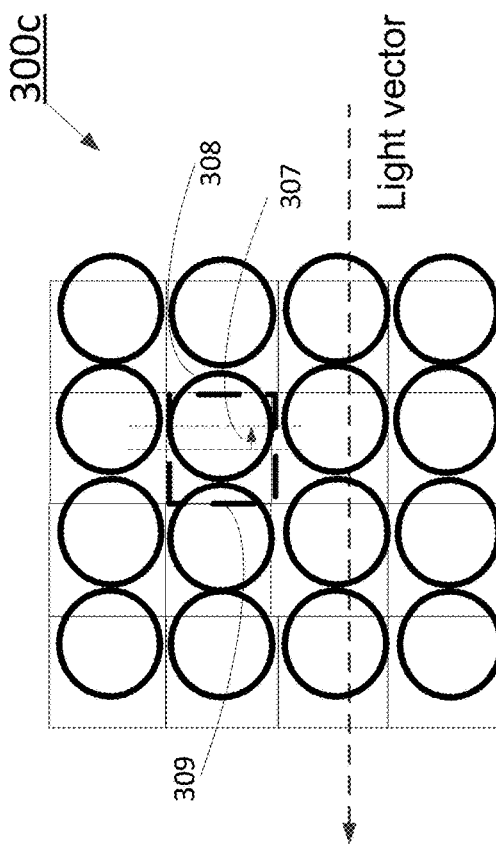
FIG. 3c

IMAGE SENSORS WITH PHASE DETECTION AUTO FOCUS PIXELS

TECHNICAL FIELD

This disclosure relates generally to semiconductor image sensors, and in particular but not exclusively, relates to image sensors with phase detection auto-focus (PDAF) pixels.

BACKGROUND INFORMATION

Image sensors have become ubiquitous. They are widely used in digital still cameras, cellular phones, security cameras, as well as medical, automotive and other applications. Many digital cameras have autofocus capabilities. Some of them use contrast autofocus, wherein the autofocus function adjusts the imaging objective to maximize contrast in at least a portion of the scene, thus bringing that portion of the scene into focus. Most recently, phase detection autofocus (PDAF) has gained popularity because it is faster than contrast autofocus. For example, phase detection autofocus (PDAF) directly measures the degree of lens focus offset by comparing light passing through one portion of the imaging objective, e.g., the left portion, with light passing through another portion of the imaging objective, e.g., the right portion. An image capture control signal is generated based on the degree of lens focus offset and provided to an electromechanical device of the image capture module to adjust the lens focus.

In order to be more compact and less expensive, image sensor devices are built with both image pixels and phase detection auto-focus (PDAF) pixels in a single image sensor on the same chip. With this type of arrangement, a camera can use the on-chip PDAF pixels to focus an image without requiring a separate phase detection sensor. However, there is an edge effect for image sensors. Although incident light around the center of the light receiving area of the image sensor is perpendicular, a periphery of the light receiving area of the image sensor is limited to incidence of, not perpendicular, but oblique light which has lower light collection rate than the perpendicular light and thus weakens image signals. In other words, sensitivity of the light receiving area deteriorates as a periphery of the image is neared, and a deterioration of image quality arises in which darkening worsens towards the periphery of the image. In order to improve the light collection rate for incident oblique light in the peripheral portion of the light receiving area, a micro-lens and color filter in an image sensor disclosed in U.S. Pat. No. 7,411,180 B2 is formed in an offset position above a light receiving element as a countermeasure for shortening of exit pupil distance. The light receiving elements include both image pixels and PDAF pixels in the same image sensor. Although such offsetting positions of micro-lens and color filters are beneficial for image pixels of the image sensor, they may degrade the accuracy of the measured degree of lens focus offset from on-chip PDAF pixels in the same image sensor. It is desirable to monitor the angular response curve and calibrate the readout signals of PDAF pixels in order to get the accurate degree of lens focus offset for every image sensor.

The conventional method for PDAF readout signal calibration comprises: after packaging each die to form an image sensor from a whole wafer, performing the bench measurement on the PDAF pixels on the image sensor to generate an angular response curve, and calibrating the readout signals of PDAF pixels based on the angular response curve during autofocus operation of the camera. Although this method requires short measurement time, it requires each die to be packaged before bench measurement, no matter if it is a good die or a bad die. It is desirable to perform PDAF pixel calibration on the whole wafer without packaging each die.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 3 is a series of zoom-in top-down views of partial image sensor pixel array in FIGS. 1 and 2: FIG. 3a is a PDAF pixel with two-by-one pattern, FIG. 3b is a PDAF pixel with two-by-two pattern and FIG. 3c is an image pixel, in accordance with an embodiment of the invention.

Figure 1:
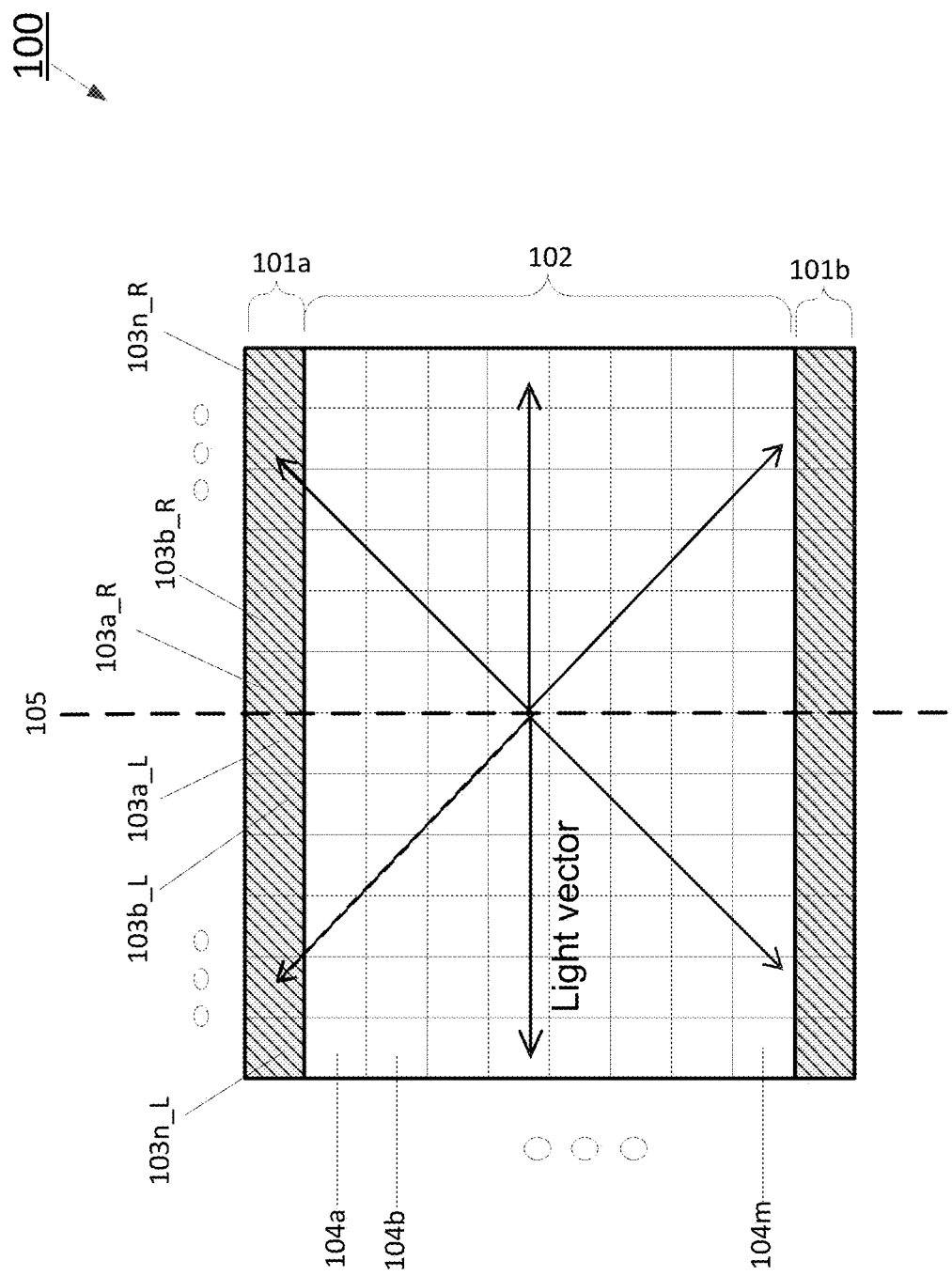
FIG. 1 is a top-down view of an image sensor pixel array with PDAF pixels in two parallel edge regions and image pixels in the center region, in accordance with an embodiment of the invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with both PDAF pixels and image pixels are described herein. In the following description, numerous specific details are set forth to provide a thorough understanding of the examples. However, one skilled in the relevant art will recognize that the techniques described herein can be practiced without one or more of the specific details, or with other methods, components, materials, etc. In other instances, well-known structures, materials, or operations are not shown or described in details in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

As an example, FIG. 1 is a top-down view of an image sensor pixel array 100, in accordance with an embodiment of the invention. The image sensor pixel array 100 comprises a center region 102 and two parallel edge regions 101a and 101b. The center region 102 comprises a plurality of image pixels (104a, 104b . . . 104m) which are disposed along a first sub-array of rows and columns. The two parallel edge regions 101a and 101b comprises a plurality of phase detection auto-focus (PDAF) pixels (103a_L, 103b_L . . . 103n_L and 103a_R, 103b_R . . . and 103n_R) disposed along a second sub-array of rows and columns. The first sub-array of rows and columns in the center region aligns with the second sub-array of rows and columns in the edge regions. Both sub-arrays are mirror symmetric to a center line 105 which crosses the center of the image sensor array 100 and perpendicular to the two parallel edge regions 101a and 101b. Since the incident light is focused along the center line 105 of the image sensor pixel array, the pixels located along the center line 105 will receive the incident light at zero tilt angle, but the pixels located at a distance away from the center line 105 will receive the incident light at a tilt angle which is determined by the distance. In FIG. 1, each of the PDAF pixels in the edge regions 101a and 101b is located at a certain distance away from the center line 105 of the edge region 101a and 101b in order to detect the incident light at a certain tilt angle. The tilt angle is bigger for a longer distance. For example, PDAF pixel 103a_L receives an incident light at a tilt angle which is the same as that of PDAF pixel 103a_R but smaller than PDAF pixel 103b_L. As one example, there may be a substantially uniform pitch between two adjacent PDAF pixels. For example, the distance between 103a_R and 103b_R is the same as the distance between 103a_L and 103b_L.

Figure 2:
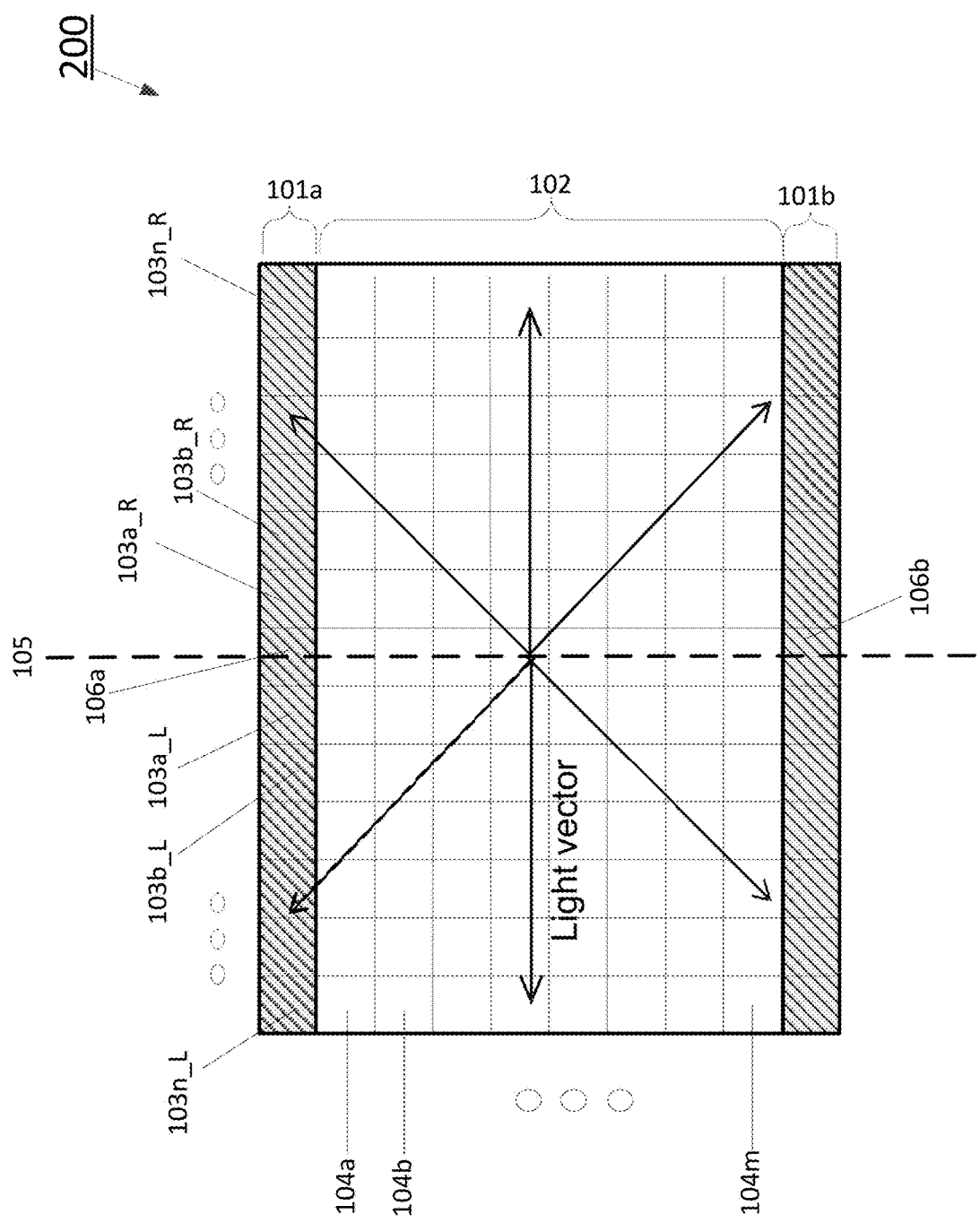
FIG. 2 is a top-down view of an image sensor pixel array with PDAF pixels in two parallel edge regions and image pixels in the center region, in accordance with an embodiment of the invention.

As another example, FIG. 2 is a top down view of an image sensor pixel array 200, in accordance with another embodiment of the invention. Besides every element included in the image sensor pixel array 100, the image sensor pixel array 200 further comprises a column of image pixels along the center line 105, a PDAF pixel 106a at the center of the edge region 101a, and a PDAF pixel 106b at the center of the edge region 101b. All the pixels along the center line 105 are used to detect the incident light at zero tilt angle.

As an example, FIG. 3c is a top down zoom-in view of an image pixel 309 in a partial first sub-array 300c from the center region 102 in FIGS. 1 and 2, in accordance with an embodiment of the invention. The arrow line illustrates the direction of the light vector. A first micro-lens (ML) 308 is formed with an offset 307 above a first light receiving area of the image pixel 309. The offset 307 is toward the opposite direction of the light vector. The offset 307 is applied as a countermeasure for shortening of exit pupil distance of the image pixel 309 in the center region 102. The more far away the image pixel 309 is from the center 105 of the center region 102, the bigger the offset 307 would be applied to the first ML 308. As a result, the light collection rate for incident oblique light in the peripheral portion of the first sub-array of image pixels in the center region 102 is improved.

As an example, FIG. 3a is a top down zoom-in view of a PDAF pixel 301 in a partial second sub-array 300a from the edge region 101a or 101b in FIG. 1 and FIG. 2, in accordance with an embodiment of the invention. The PDAF pixel 301 comprises 2×1 light sensing elements with a left side light receiving area (L) and a right side light receiving area (R)) sharing a common micro-lens (ML) 302. The common ML 302 has an optical axis centered between the 2×1 light sensing elements (L and R). Because the common ML 302 aligns with the PDAF pixel 301, when the PDAF pixel 301 directly measures the degree of lens focus offset by comparing light passing through L with light passing through R, the degree of lens focus offset is not impacted by any offset between the micro-lens 302 and the PDAF pixel 301. Therefore, the image capture control signal generated based on the degree of lens focus offset is more accurate. As a result, the adjustment of the lens focus is more accurate when providing the degree of lens focus offset to an electromechanical device of the image capture module to adjust the lens focus. Moreover, the PDAF pixel 301 has a scan direction along the light vector direction (arrow direction). The scan direction is designed to be parallel to the two parallel edge regions 101a and 101b of the image sensor 100 or image sensor 200. The two parallel edge regions 101a and 101b may be left edge and right edge of the image sensor 100 or image sensor 200. The two parallel edge regions 101a and 101b may also be top edge and bottom edge of the image sensor 100 or image sensor 200. The rest of pixels in 300a, such as pixel 303, are all dummy pixels which are not used to collect any valid readout signals. The micro-lens is aligned with the light receiving area in every dummy pixel in order to keep the process simple.

As an example, FIG. 3b is a top down zoom-in view of a PDAF pixel 304 in a partial second sub-array 300b from the edge region 101a or 101b in FIG. 1 and FIG. 2, in accordance with an embodiment of the invention. The PDAF pixel 304 comprises 2×2 light sensing elements A, B, C, D which share a common micro-lens (ML) 305. The common ML 305 has an optical axis centered at the center of 2×2 light sensing elements A, B, C and D. Because the common ML 305 aligns with the PDAF pixel 304, when the PDAF pixel 304 directly measures the degree of lens focus offset by comparing light passing through one of 2×2 light sensing elements A, B, C and D with light passing through another one of 2×2 light sensing elements A, B, C and D, the degree of lens focus offset is not impacted by any offset between the micro-lens 305 and the PDAF pixel 304. Therefore, the image capture control signal generated based on the degree of lens focus offset is more accurate. As a result, the adjustment of the lens focus is more accurate when providing the degree of lens focus offset to an electromechanical device of the image capture module to adjust the lens focus. Moreover, the PDAF pixel 304 has scan directions along both horizontal and vertical light vector directions (arrow directions). The scan direction is designed to be parallel to the two parallel edge regions 101a and 101b of the image sensor 100 or image sensor 200. The two parallel edge regions 101a and 101b may be left edge and right edge of the image sensor 100 or image sensor 200. The two parallel edge regions 101a and 101b may also be top edge and bottom edge of the image sensor 100 or image sensor 200. The rest of pixels in 300b, such as pixel 306, are all dummy pixels which are not used to collect any valid readout signals. The micro-lens is aligned with the light receiving area in every dummy pixel in order to keep the process simple.

Figure 4:
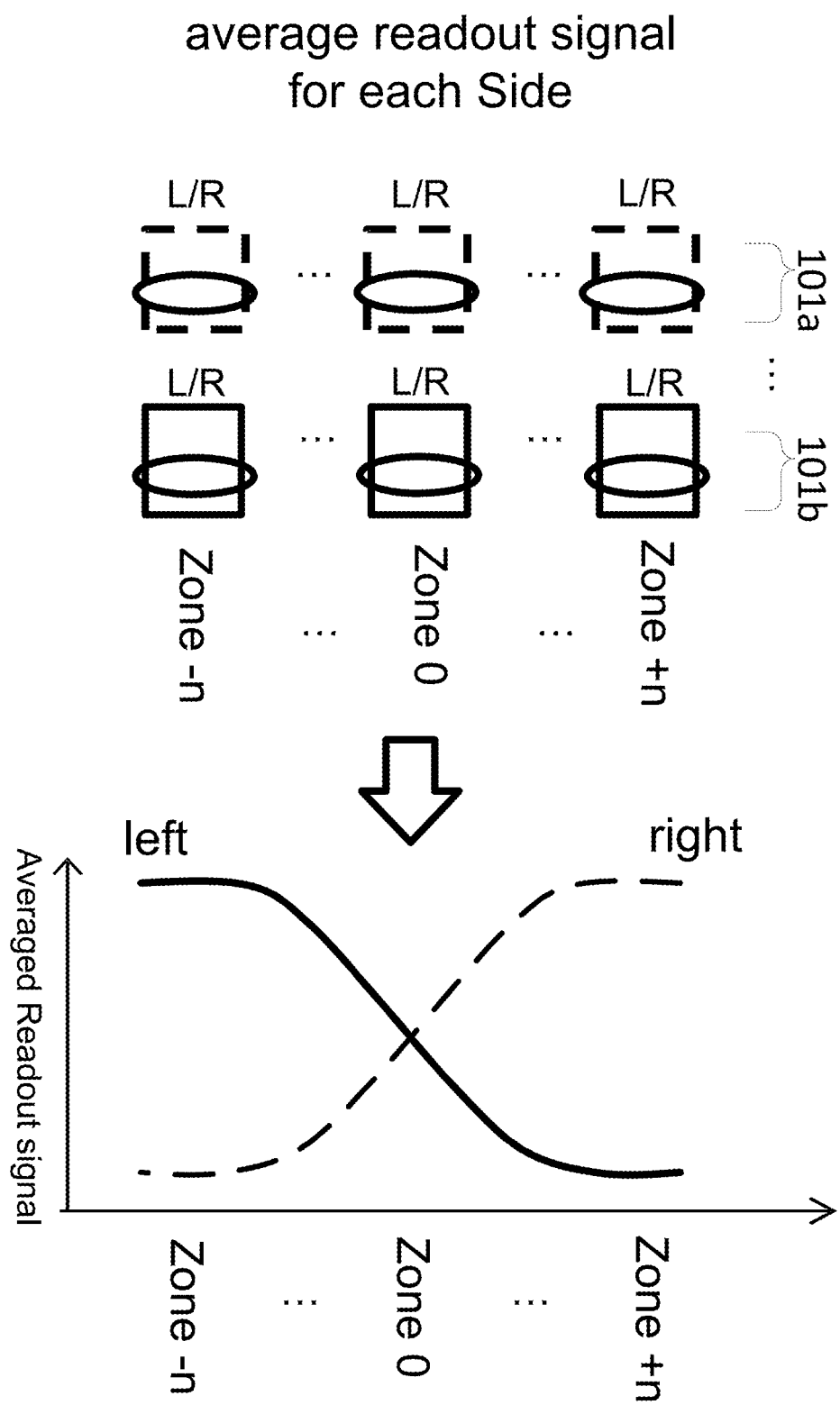
FIG. 4 illustrates a method to generate an angular response curve based on the averaged readout signals from the left and right side of a PDAF pixel on the same rows in FIGS. 1 and 2, in accordance with an embodiment of the invention.
Figure 5B:
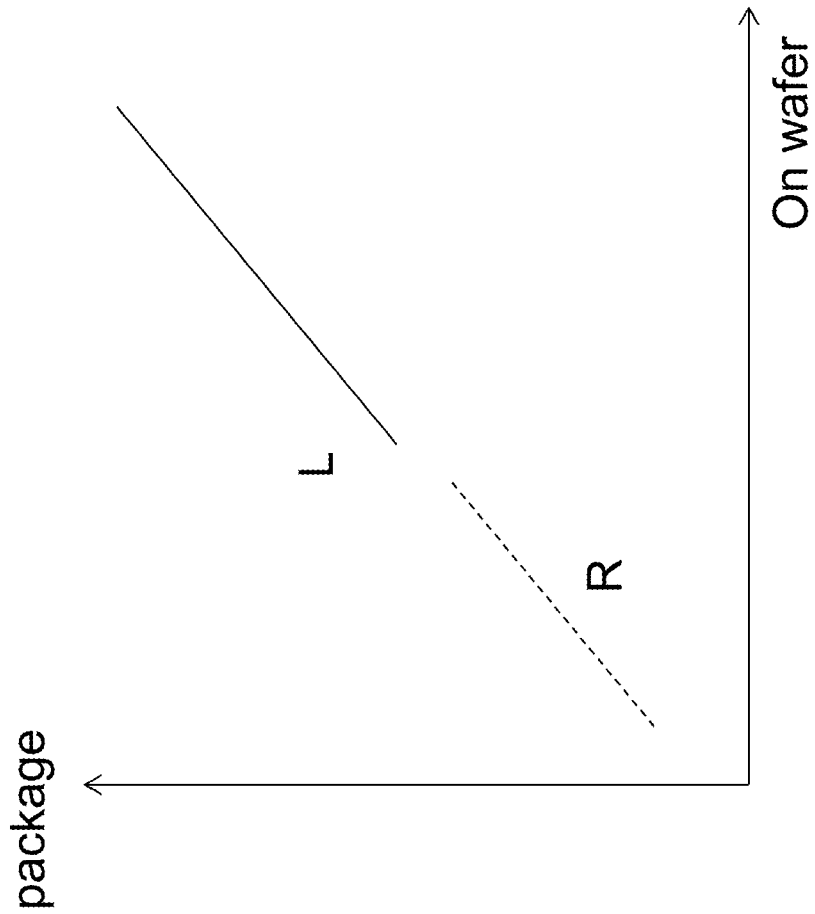
FIG. 5a and 5b illustrate the last step of the calibration method in accordance with an embodiment of the invention.
Figure 5A:
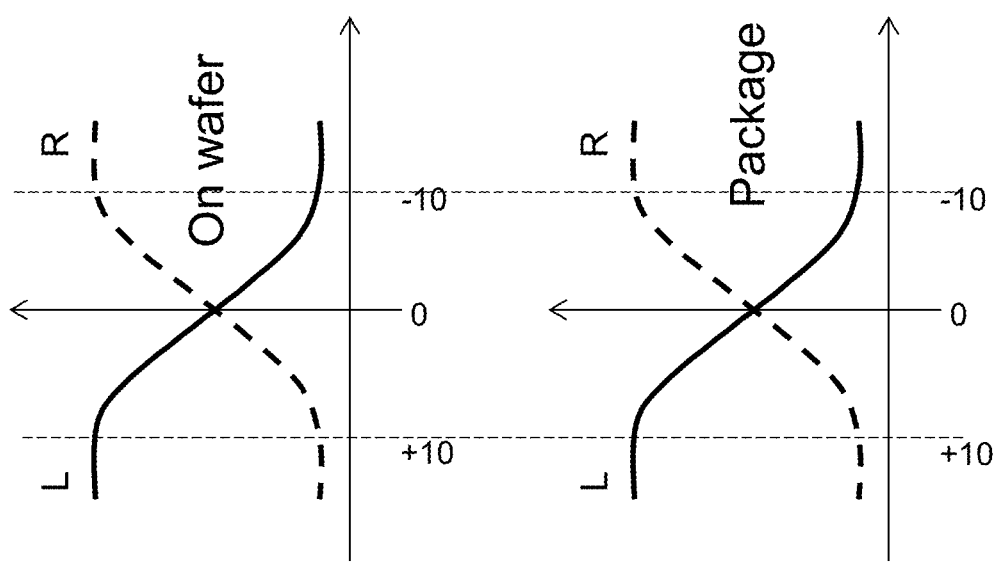

As an example, FIG. 4 illustrates a method to calibrate 2×1 PDAF pixels on a semiconductor wafer, in accordance with an embodiment of the invention. Although not illustrated in FIG. 4, the method can be applied to calibrate 2×1 PDAF pixels on the semiconductor wafer. The first step is to form a plurality of image sensors as described in the previous paragraphs on the semiconductor wafer. As an example in FIG. 4, the PDAF pixels are 2×1 PDAF pixels with left light receiving area and right light receiving area sharing a common micro-lens in the same PDAF pixel, as described in FIG. 3a. The second step is to calculate the light injection tilt angle for each light receiving area in each 2×1 PDAF pixel based on the distance from each light receiving area to the center of the edge region; the injection tilt angles for each light receiving area are defined by chip size and light source chip ray angle (CRA); by utilizing the injection tilt angles, each light receiving area address is converted to the injection tilt angles. The third step is to measure a readout signal from both left and right light sensing element of each PDAF pixel. The fourth step is to match the injection tilt angle with the respective readout signal from each light sensing element of the PDAF pixel; The fifth step is to calculate the average of the readout signals from the left light sensing elements of the PDAF pixels at the same light injection tile angle; also calculate the average of the readout signals from the right light sensing elements of the PDAF pixels at the same light injection tile angle; The sixth step is to generate a first angular response curve to illustrate the correlation between the averaged readout signals and its respective tilt angle for both left and right light sensing element of the PDAF pixel. The seventh step is to package each of the image sensors after the calibration is completed and then generate a second angular response curve for each of the packed image sensors. The last step is to make a correlation between the first and the second angular response curves measured on each of the image sensors before and after packaging. FIG. 5b shows an example of the correlation curve. As an indicator for correlation, the specific angle is defined, and the specific angle should match between the monitor pattern signal and the angular response on the package (FIG. 5a). For example, +10 degree point is selected. The correlation curve allows us to predict the PDAF performance on the semiconductor wafer.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize. These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor pixel array, comprising a center region and two parallel edge regions, wherein the center region is between the two parallel edge regions, wherein:
    the center region comprises a plurality of image pixels disposed along first sub-array of rows and columns, wherein
        each of the plurality of image pixels comprises a first micro-lens (ML) formed at an offset position above a first light receiving element as a countermeasure for shortening of exit pupil distance of the image pixel in the center region;
    each of the two parallel edge regions comprises a plurality of phase detection auto-focus (PDAF) pixels disposed along second sub-array of rows and columns, wherein
        each of the plurality of PDAF pixels comprises a second micro-lens (ML) formed at an alignment position above a second light receiving element; and
    at least one of the PDAF pixels is located at a distance away from center of the edge region to receive incident light along an injection tilt angle.

2. The image sensor pixel array in claim 1, wherein the two parallel edge regions comprising the plurality of PDAF pixels disposed along the second sub-array of rows and columns and the center region comprising the plurality of image pixels disposed along the first sub-array of rows and columns are mirror symmetric to a line across center of the image sensor pixel array and center of each of two parallel edge regions.

3. The image sensor pixel array in claim 1, further comprising a PDAF pixel located at center of each of the two parallel edge regions to receive perpendicular incident light along zero tilt angle.

4. The image sensor pixel array in claim 1, wherein two adjacent PDAF pixels is separated by a substantially uniform pitch in each of the two parallel edge regions.

5. The image sensor pixel array in claim 1, wherein each of the PDAF pixels comprises 2×2 photo diodes sharing a common micro-lens (ML) and color filter (CF), wherein the common ML has an optical axis centered at the center of 2×2 photo diodes.

6. The image sensor pixel array in claim 1, wherein each of the PDAF pixels comprises 2×1 photodiodes sharing a common micro-lens (ML) and color filter (CF), wherein the common ML has an optical axis centered between the 2×1 photodiodes, wherein each of the PDAF pixels has a scan direction parallel to the edge region of the image sensor.

7. A method to calibrate PDAF pixels on a semiconductor wafer, comprising:
    step 1: forming a plurality of image sensors on the semiconductor wafer, wherein each of the image sensors comprises an image sensor pixel array, wherein the image sensor pixel array comprises a center region and two parallel edge regions, wherein the center region is between the two parallel edge regions, wherein:
        the center region comprises a plurality of image pixels disposed along first array of rows and columns, wherein
            each of the plurality of image pixels comprises a first micro-lens (ML) formed at an offset position above a first light receiving element as a countermeasure for shortening of exit pupil distance of the image pixel in the center region;
        each of the two parallel edge regions comprises a plurality of phase detection auto-focus (PDAF) pixels disposed along second array of rows and columns, wherein
            each of the PDAF pixels comprises a second micro-lens (ML) formed at an alignment position above a second light receiving element; and
        at least one of the PDAF pixels is located at a distance away from center of the edge region to receive incident light along an injection tilt angle;
    step 2: calculating light injection tilt angle for each light receiving element of each PDAF pixel based on the distance from each light receiving element of each PDAF pixel to the center of the edge region for each of the image sensors;

step 3: measuring a readout signal from each light receiving element of each PDAF pixel for each of the image sensors;

step 4: matching the injection tilt angle with the readout signal from the light receiving element of the PDAF pixel for each of the image sensors;

step 5: averaging readout signals from the light receiving elements of the PDAF pixels at the same light injection tile angle along the same second row for each of the image sensors;

step 6: generating a first angular response curve and performing calibration for each of the PDAF pixels for each of the image sensors;

step 7: packaging each of the image sensors after the calibration is finished, and then generating a second angular response curve for each packed image sensor;

Step 8: making a correlation between the first and the second angular response curves measured on each of the image sensors before and after packaging.

8. The method in claim 7, wherein
the two parallel edge regions comprising the plurality of PDAF pixels disposed along the second array of rows and columns and the center region comprising the plurality of image pixels disposed along with the first array of rows and columns are mirror symmetric to a line cross center of the center region and center of each of the two parallel edge regions.

9. The method in claim 7, wherein the image sensor pixel array further comprising a PDAF pixel located at center of each of the two parallel edge regions to receive perpendicular incident light along zero tilt angle.

10. The method in claim 7, wherein there is a substantially uniform pitch between two adjacent PDAF pixels in each of the two parallel edge regions.

11. The method in claim 7, wherein each of the PDAF pixels comprises 2×2 photodiodes sharing a common microlens (ML) and color filter (CF), wherein the common ML has an optical axis centered at the center of 2×2 photo diodes.

12. The method in claim 7, wherein each of the PDAF pixels comprises 2×1 photodiodes sharing a common microlens (ML) and color filter (CF), wherein the common ML has an optical axis centered between the 2×1 photodiodes, wherein each of the PDAF pixels has a scan direction parallel to the edge region of the image sensor.

* * * * *